(12) United States Patent
Vasyltsov et al.

(10) Patent No.: US 8,443,022 B2
(45) Date of Patent: May 14, 2013

(54) APPARATUS AND METHOD FOR GENERATING RANDOM NUMBER

(75) Inventors: Ihor Vasyltsov, Suwon-si (KR); Eduard Hambardzumyan, Suwon-si (KR); Bohdan Karpinskyy, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 947 days.

(21) Appl. No.: 12/462,825

(22) Filed: Aug. 10, 2009

(65) Prior Publication Data

US 2010/0201419 A1 Aug. 12, 2010

(30) Foreign Application Priority Data

Feb. 9, 2009 (KR) .................. 10-2009-0010201

(51) Int. Cl.
*G06F 7/58* (2006.01)
*G06F 1/02* (2006.01)

(52) U.S. Cl.
USPC ........... 708/250; 708/205; 708/207; 708/209; 708/256

(58) Field of Classification Search .................. None
See application file for complete search history.

(56) References Cited

U.S. PATENT DOCUMENTS

| | | | |
|---|---|---|---|
| 7,315,874 B2 | 1/2008 | Hars | |
| 7,424,500 B2 | 9/2008 | Fukushima et al. | |
| 2004/0264233 A1 | 12/2004 | Fukushima et al. | |
| 2007/0273408 A1 | 11/2007 | Golic | |
| 2008/0091755 A1 | 4/2008 | Mudge et al. | |
| 2008/0309533 A1* | 12/2008 | Baker | 341/143 |
| 2008/0313249 A1 | 12/2008 | Fukushima et al. | |
| 2009/0106339 A1 | 4/2009 | Vasyltsov et al. | |
| 2009/0327381 A1* | 12/2009 | Morad | 708/252 |

FOREIGN PATENT DOCUMENTS

| | | |
|---|---|---|
| JP | 2005-18251 | 1/2005 |
| KR | 10-2006-0125855 A | 12/2006 |
| KR | 10-2009-0040136 | 4/2009 |

OTHER PUBLICATIONS

Vasyltsov, Ihor, et al., "Fast Digital TRNG Based on Metastable Ring Oscillator", Cryptographic Hardware and Embedded Systems CHES 2008: Proceedings of the 10th International Workshop, Washington, D.C., USA, Aug. 10-13, 2008, LNCS 5154, International Association for Cryptologic Research, 2008, 164-180.

* cited by examiner

*Primary Examiner* — Scott Sun
(74) *Attorney, Agent, or Firm* — Onello & Mello, LLP

(57) ABSTRACT

A random number generating apparatus and method for generating a metastable state signal by using logic gates include a metastable state generating unit generating and outputting a metastable state signal; an amplifying unit receiving the metastable state signal from the metastable state generating unit, amplifying the received metastable state signal, and outputting the amplified metastable state signal; and a sampling unit receiving the amplified metastable state signal and a sampling clock, and sampling and outputting the amplified metastable state signal according to the sampling clock.

10 Claims, 9 Drawing Sheets

APPARATUS AND METHOD FOR GENERATING RANDOM NUMBER

CROSS-REFERENCE TO RELATED APPLICATIONS

This application claims the benefit under 35 U.S.C. 119 of Korean Patent Application No. 10-2009-0010201, filed on Feb. 9, 2009, in the Korean Intellectual Property Office, the entire contents of which are incorporated herein by reference.

BACKGROUND

The inventive concept relates to a random number generating apparatus and method, and more particularly, to a random number generating apparatus and method for generating a metastable state signal by using logic gates.

Metastability is widely used in a true random number generator (TRNG) since it has been known to have good stochastic properties. However, conventionally, a natural occurrence of metastability is very rare, thus causing a reduction in the value of either accumulated entropy or TRNG throughput.

SUMMARY

The inventive concept provides a random number generating apparatus and method for generating a metastable state signal by using logic gates.

According to an aspect of the inventive concept, there is provided an apparatus for generating a random number, the apparatus comprising: a metastable state generating unit generating and outputting a metastable state signal; an amplifying unit receiving the metastable state signal from the metastable state generating unit, amplifying the received metastable state signal, and outputting the amplified metastable state signal; and a sampling unit receiving the amplified metastable state signal and a sampling clock, and sampling and outputting the amplified metastable state signal according to the sampling clock.

The metastable state generating unit may include an inverting unit inverting and outputting an input signal, wherein an output terminal and an input terminal of the inverting unit are connected to each other.

The metastable state generating unit may further include a multiplexer receiving a select signal and selectively outputting input signals in response to the select signal, wherein a first input terminal of the multiplexer is connected to the output terminal of the inverting unit, a second input terminal of the multiplexer is connected to a first power voltage, and an output terminal of the multiplexer is connected to the input terminal of the inverting unit.

The metastable state generating unit may include a plurality of inverting units inverting and outputting an input signal, wherein the plurality of inverting units are connected in parallel to each other, and an output terminal and input terminal of each of the plurality of inverting units are connected to each other.

The amplifying unit may include a plurality of amplification stages amplifying and outputting an input signal, wherein the plurality of amplification stages are connected in series to each other, each of the plurality of amplification stages comprises a plurality of unit amplification circuits amplifying and outputting the input signal, and the plurality of unit amplification circuits are connected in parallel to each other.

According to another aspect of the inventive concept, there is provided an apparatus for generating a random number including a plurality of random number generators, the apparatus including: a controller providing the plurality of random number generators with a first control signal and generating and outputting a second control signal; and a selector receiving a signal from each of the plurality of random number generators and the second control signal, and selectively outputting an output signal of the apparatus in response to the second control signal, wherein each of the plurality of random number generators comprises: a metastable state generating unit generating and outputting a metastable state signal; an amplifying unit receiving the metastable state signal from the metastable state generating unit, amplifying the received metastable state signal, and outputting the amplified metastable state signal; and a sampling unit receiving the amplified metastable state signal and a sampling clock, and sampling and outputting the amplified metastable state signal according to the sampling clock.

The selector may include a multiplexer selectively outputting the signal of each of the plurality of random number generators in response to the second control signal.

The selector may include an XOR gate performing an XOR operation with regard to the signal of each of the plurality of random number generators and outputting the XOR performed signal; and a flipflop receiving the output signal of the XOR gate, and sampling and outputting the received output signal of the XOR gate in response to the second control signal.

The first control signal may include a plurality of sampling clocks that are input into the plurality of random number generators, wherein the plurality of sampling clocks have different delay time.

According to another aspect of the inventive concept, there is provided a method of generating a random number, the method comprising: generating and outputting a metastable state signal; receiving the metastable state signal, amplifying the received metastable state signal, and outputting the amplified metastable state signal; and receiving the amplified metastable state signal and a sampling clock, and sampling and outputting the amplified metastable state signal according to the sampling clock.

BRIEF DESCRIPTION OF THE DRAWINGS

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE EMBODIMENTS

Figure 1:
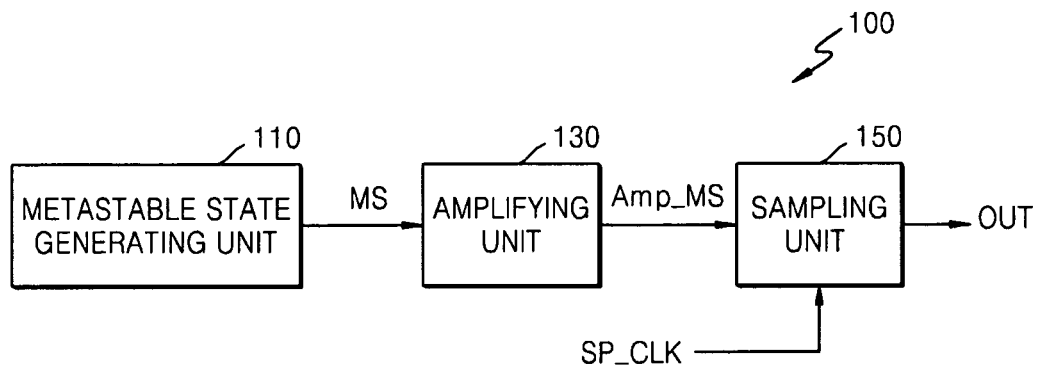
FIG. 1 is a block circuit diagram of a random number generating apparatus according to an exemplary embodiment.

Hereinafter, the inventive concept will be described in detail by describing exemplary embodiments of the inventive concept with reference to the attached drawings. Like reference numerals in the drawings denote like elements.

FIG. 1 is a block circuit diagram of a random number generating apparatus 100 according to an exemplary embodiment. Referring to FIG. 1, the random number generating apparatus 100 of the present embodiment may include a metastable state generating unit 110, an amplifying unit 130, and a sampling unit 150. The metastable state generating unit 110 generates and outputs a metastable state signal MS. The metastable state signal MS and the metastable state generating unit 110 will be described below in more detail with reference to FIGS. 2A through 2C.

The amplifying unit 130 receives the metastable state signal MS from the metastable state generating unit 110, amplifies the received metastable state signal MS, and outputs the amplified metastable state signal Amp_MS. The sampling unit 150 receives the amplified metastable state signal Amp_MS and a sampling clock SP_CLK, and samples and outputs the amplified metastable state signal Amp_MS according to the sampling clock SP_CLK. An output OUT of the sampling unit 150, which is a value obtained by sampling the amplified metastable state signal Amp_MS according to the sampling clock SP_CLK, has properties of a true random number.

Figure 2A:
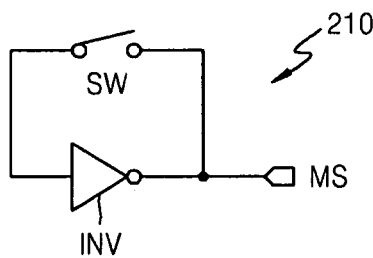
FIG. 2A is a circuit diagram of a metastable state generating unit according to an exemplary embodiment.

FIG. 2A is a circuit diagram of a metastable state generating unit 210 according to an exemplary embodiment. Referring to FIG. 2A, the metastable state generating unit 210 may include an inverter INV that inverts and outputs a received signal. The inverter INV may be connected to an input terminal and an output terminal. A switch SW may be connected between the input terminal and the output terminal of the inverter INV. It is determined whether the switch SW is turned on or off in response to a control signal (not shown) that is received from outside the unit 210. If the switch SW is turned on, the input terminal and the output terminal of the inverter INV are connected to each other, and thus the metastable state generating unit 210 outputs the metastable state signal MS. In more detail, if the input terminal and the output terminal of the inverter INV are connected to each other in a loop shape by the switch SW, an output voltage of the inverter INV is converged to a metastable level and continuously remains in a metastable state. The output voltage of the inverter INV stochastically varies from the metastable level due to a thermal noise.

Figure 2B:
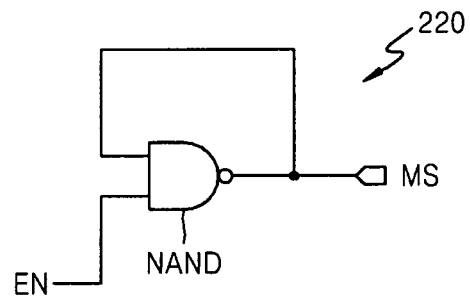
FIG. 2B is a circuit diagram of a metastable state generating unit according to another exemplary embodiment.

FIG. 2B is a circuit diagram of a metastable state generating unit 220 according to another exemplary embodiment. Referring to FIG. 2B, the metastable state generating unit 220 may include a NAND gate. A first input terminal of the NAND gate may be connected to an output terminal thereof. An enable signal EN may be input into a second input terminal of the NAND gate.

When the enable signal EN is in a logic low state, an output of the NAND gate is in a logic high state, and an output of the NAND gate is fed back and input into the first input terminal of the NAND gate. In this regard, since the enable signal EN is in the logic low state, if the output of the NAND gate is fed back and input into the first input terminal of the NAND gate in the logic high state, the output of the NAND gate is stably in the logic high state.

When the enable signal EN is in a logic high state, a logic state of an output terminal of the NAND gate is an inversion of a logic state of the first input terminal of the NAND gate. In more detail, if the enable signal EN is in the logic high state, the NAND gate operates similarly to the inverter INV shown in FIG. 2A. If the enable signal EN is in the logic high state, the NAND gate outputs the metastable state signal MS.

The metastable state generating units 210 and 220 shown in FIGS. 2A and 2B, respectively, are exemplary embodiments of the inventive concept. Other configurations of the metastable state generating units 210 and 220 are possible. For example, the metastable state generating unit 110 shown in FIG. 1 can be realized by using a logic element, such as an NOR gate or an XOR gate, instead of the inverter INV and the NAND gate shown in FIGS. 2A and 2B, respectively.

Figure 2C:
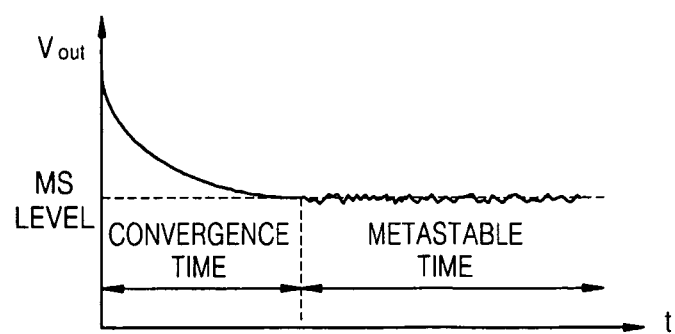
FIG. 2C is a waveform illustrating outputs of the metastable state generating units shown in FIGS. 1, 2A, and 2B according to an exemplary embodiment.

FIG. 2C is a waveform illustrating outputs of the metastable state generating units 110, 210, and 220 according to an exemplary embodiment. The waveform shown in FIG. 2C illustrates the output of the inverter INV if the switch SW is turned on with reference to FIG. 2A and the output of the NAND gate if the enable signal EN is in the logic high state with reference to FIG. 2B. Referring to FIG. 2C, when the output signal MS of the metastable state generating units 110, 210, and 220 is initially converged to a predetermined value during a convergence time period, and arrives at an MS level after a predetermined period of time, the metastable state generating units 110, 210, and 220 output a metastable state signal during a metastable time period. The output signal MS of the metastable state generating units 110, 210, and 220 slightly varies near the MS level during the metastable time period.

Figure 3:
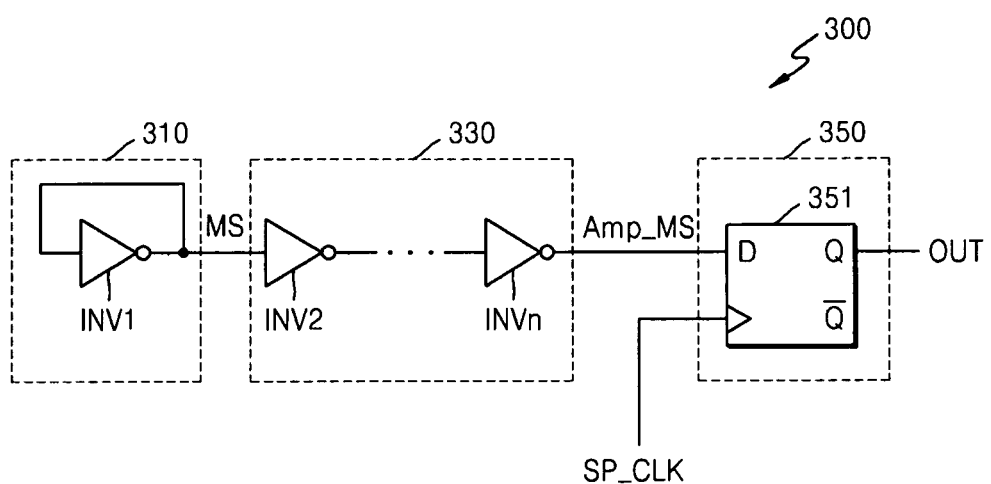
FIG. 3 is a circuit diagram of a random number generating apparatus according to another exemplary embodiment.

FIG. 3 is a block circuit diagram of a random number generating apparatus 300 according to another exemplary embodiment. Referring to FIG. 3, the random number generating apparatus 300 of the present embodiment is a specific embodiment of the random number generating apparatus 100 including the metastable state generating unit 110, the amplifying unit 130, and the sampling unit 150.

A metastable state generating unit 310 may include an inverter INV1. An output terminal of the inverter INV1 may be fed back and connected to an input terminal thereof. Like the metastable state generating unit 210 shown in FIG. 2A, a switch may be connected between the output terminal and the input terminal of the inverter INV1. The operation of the metastable state generating unit 310 is described with reference to FIGS. 2A and 2C and thus its description will not be repeated here.

An amplifying unit 330 receives the metastable state signal MS from the metastable state generating unit 310, amplifies the received metastable state signal MS, and outputs the amplified metastable state signal Amp_MS. The amplifying unit 330 may include at least one inverter INV2 through INVn, which may be connected in series to each other. The metastable state signal MS received by the amplifying unit 330 is amplified, inverted, and output whenever passing through each inverter. The metastable state signal MS received by the amplifying unit 330 may be amplified to a level to the extent that a sampling unit 350 can sample the metastable state signal MS while passing through the inverters INV2 and INVn. In more detail, since the output signal MS of the metastable state generating unit 310 slightly varies near the MS level in the same manner as shown in FIG. 2C, the metastable state signal MS may be sampled in the sampling unit 350 after being amplified to a sampling level rather than being directly sampled. For example, the inverters INV1, INV2, and INVn may be elements manufactured during the same process.

The amplifying unit 330 amplifies the metastable state signal MS and outputs the amplified metastable state signal Amp_MS.

The sampling unit 350 receives the amplified metastable state signal Amp_MS and the sampling clock SP_CLK, and samples and outputs the amplified metastable state signal Amp_MS according to the sampling clock SP_CLK. An output OUT of the sampling unit 350, which is a value obtained by sampling the amplified metastable state signal Amp_MS according to the sampling clock SP_CLK, has properties of a true random number. For example, the sampling unit 350 may include a D flipflop 351. The construction and operation of the D flipflop 351 are generally known and thus its detailed description will not be repeated here.

Figure 4:
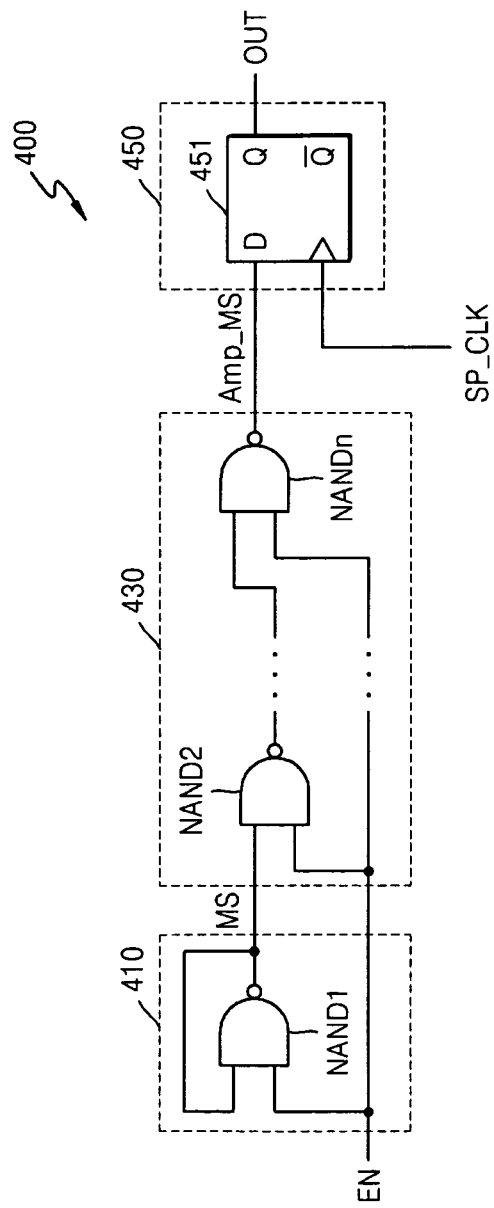
FIG. 4 is a circuit diagram of a random number generating apparatus according to another exemplary embodiment.

FIG. 4 is a block circuit diagram of a random number generating apparatus 400 according to another exemplary embodiment. Referring to FIG. 4, the random number generating apparatus 400 of the present embodiment is a specific embodiment of the random number generating apparatus 100 including the metastable state generating unit 110, the amplifying unit 130, and the sampling unit 150.

The random number generating apparatus 400 of the present embodiment includes a metastable state generating unit 410, an amplifying unit 430, and a sampling unit 450. The metastable state generating unit 410 includes a NAND gate NAND1. A first input terminal of the NAND gate NAND1 may be connected to an output terminal thereof. The enable signal EN may be input into a second input terminal of the NAND gate NAND1. As described with reference to FIG. 2B, when the enable signal EN is in a logic low state, the NAND gate NAND1 outputs a stable signal, whereas when the enable signal EN is in a logic high state, the NAND gate NAND1 outputs the metastable state signal MS.

The amplifying unit 430 receives the metastable state signal MS from the metastable state generating unit 410, amplifies the received metastable state signal MS, and outputs the amplified metastable state signal Amp_MS. The amplifying unit 430 may include at least one NAND gates NAND2 and NANDn, which may be connected in series to each other. In more detail, a first input terminal of the NAND gate NAND2 may be connected to an output terminal thereof. The enable signal EN may be input into a second input terminal of the NAND gate NAND2. The output terminal of the NAND gate NAND2 may be connected to a first input terminal of a next NAND gate (not shown).

When the enable signal EN is in a logic high state, the NAND gates NAND2 and NANDn operate similarly to an inverter. Therefore, as described with reference to FIG. 3, when the enable signal EN is in the logic high state, the metastable state signal MS received by the amplifying unit 430 is amplified, inverted, and output whenever passing through each NAND gate. The metastable state signal MS received by the amplifying unit 430 may be amplified to a level that the sampling unit 450 can sample the metastable state signal MS while passing through the NAND gates NAND2 and NANDn.

The sampling unit 450 may include a D flipflop 451. The sampling unit 450 is described with reference to FIG. 3 and thus its detailed description will not be repeated here.

Although the metastable state generating unit 310 and the amplifying unit 330 of the random number generating apparatus 300 shown in FIG. 3 are realized by using the inverters INV1, INV2, and INVn, and the metastable state generating unit 410 and the amplifying unit 430 of the random number generating apparatus 400 shown in FIG. 4 are realized by using the NAND gates NAND1, NAND2 and NANDn, the inventive concept is not limited thereto. In more detail, a random number generating apparatus according to another exemplary embodiment may be realized by using the metastable state generating unit 310 shown in FIG. 3 and the amplifying unit 430 shown in FIG. 4.

Figure 5:
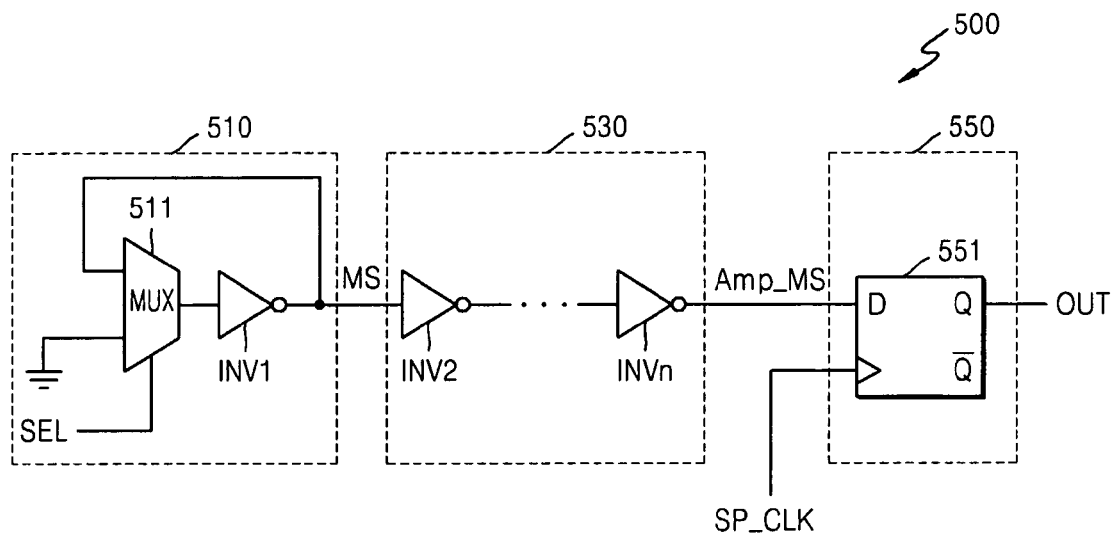
FIG. 5 is a circuit diagram of a random number generating apparatus according to another exemplary embodiment.

FIG. 5 is a block circuit diagram of a random number generating apparatus 500 according to another exemplary embodiment. The random number generating apparatus 500 may be used for a mobile and portable device for reducing power consumption. It may be determined whether a metastable state generating unit 510 is enabled according to a select signal SEL.

The random number generating apparatus 500 may include the metastable state generating unit 510, an amplifying unit 530, and a sampling unit 550. The constructions and operations of the amplifying unit 530 and the sampling unit 550 are similar to those described with reference to FIG. 3 and thus their detailed descriptions will not be repeated here.

Referring to FIG. 5, the metastable state generating unit 510 may include a multiplexer 511 and an inverter INV1. A first input terminal of the multiplexer 511 may be connected to an output terminal of the inverter INV1. A second input terminal of the multiplexer 511 may be connected to a ground voltage Vss. An output terminal of the multiplexer 511 may be connected to an input terminal of the inverter INV1.

The multiplexer 511 receives the select signal SEL, and selectively outputs signals in response to the select signal SEL. For example, when the select signal SEL is in a logic low state, the multiplexer 511 may output a signal received by the first input terminal, and when the select signal SEL is in a logic high state, the multiplexer 511 may output a signal received by the second input terminal.

When the select signal SEL is in the logic low state, since the signal input into the first input terminal of the multiplexer 511 is sent to the output terminal of the multiplexer 511, the output terminal and the input terminal of the inverter INV1 are connected to each other in a loop shape. Therefore, as described with reference to FIG. 2A, when the select signal SEL is in the logic low state, the inverter INV1 outputs the metastable state signal MS.

When the select signal SEL is in the logic high state, since the signal input into the second input terminal of the multiplexer 511 is sent to the output terminal of the multiplexer 511, the input terminal of the inverter INV1 is input into the logic low state of the ground voltage Vss. In this case, the inverter INV1 outputs a logic high state signal. If the select signal SEL is in the logic high state, an output signal of the inverter INV1 is not fed back to the input terminal of the inverter INV1. Therefore, when the select signal SEL is in the logic high state, the metastable state generating unit 510 does not output a metastable state signal MS but outputs a logic high state signal of a predetermined level.

A power voltage Vdd may be connected to the second input terminal of the multiplexer 511, instead of the ground voltage Vss. When the select signal SEL is in the logic low state, the multiplexer 511 may output the signal received by the second input terminal. When the select signal SEL is in the logic high state, the multiplexer 511 may output the signal received by the first input terminal. The multiplexer 511 shown in FIG. 5 is an exemplary select element. Other configurations of a select element may be used.

Figure 6:
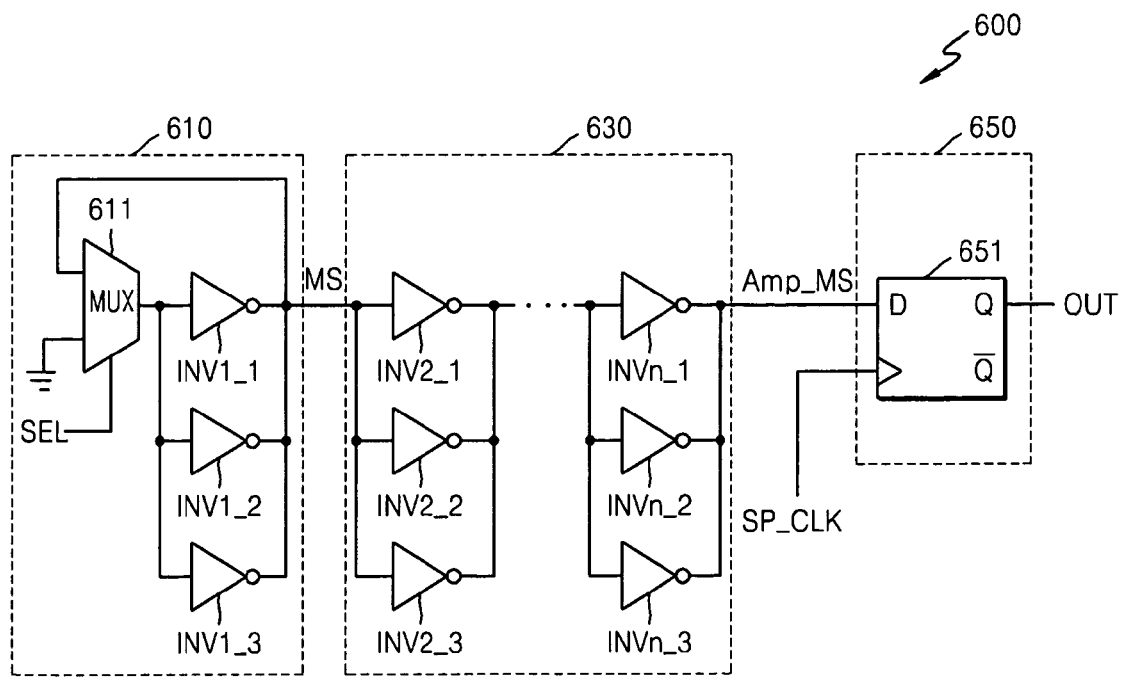
FIG. 6 is a circuit diagram of a random number generating apparatus according to another exemplary embodiment.

FIG. 6 is a block circuit diagram of a random number generating apparatus 600 according to another exemplary embodiment. The random number generating apparatus 600 may include a metastable state generating unit 610, an amplifying unit 630, and a sampling unit 650. The construction and operation of the sampling unit 650 are similar to those described with reference to FIG. 3 and thus its detailed descriptions will not be repeated here.

Referring to FIG. 6, the metastable state generating unit 610 may include a plurality of inverting units that invert and output a received signal. The inverting units may be connected in parallel to each other. An output terminal of each of the inverting units and an input terminal of each of the inverting units may be connected to each other. For example, the inverting units may be realized as a plurality of inverters INV1_1, INV1_2, and INV1_3. Also, as described with reference to FIGS. 2B and 4, the inverting unit may be realized by using logic elements, such as NAND gates, NOR gates or XOR gates. Although the metastable state generating unit 610 of the present embodiment includes three inverting units, the inventive concept is not limited thereto.

The metastable state generating unit 610 may include the inverters INV1_1, INV1_2, and INV1_3. The metastable state generating unit 610 may further include a multiplexer 611. Input terminals of the inverters INV1_1, INV1_2, and INV1_3 may be connected to an output terminal of the multiplexer 611. Output terminals of the inverters INV1_1, INV1_2, and INV1_3 may be connected to a first input terminal of the multiplexer 611. In more detail, the inverters INV1_1, INV1_2, and INV1_3 may be connected in parallel to each other. The ground voltage Vss may be connected to a second input terminal of the multiplexer 611. The multiplexer 611 selectively outputs a received signal in response to the select signal SEL.

When the metastable state generating unit 610 includes the inverters INV1_1, INV_2, and INV1_3 that are connected in parallel to each other, the average mismatch properties between the inverters INV1_1, INV1_2, and INV1_3 may be reduced. In more detail, transistors manufactured during the same process have slightly different properties due to a process variation. The inverters INV1_1, INV1_2, and INV1_3 included in the metastable state generating unit 610 are connected in parallel to each other, thereby reducing average mismatch properties of transistors. In more detail, the random number generating apparatus 600 may be useful in case of a small yield thereof due to a large process variation.

The amplifying unit 630 may include a plurality of amplification stages that amplify and output a received signal and may be connected in series to each other. Each of the amplification stages may include a plurality of unit amplification circuits that amplify and output the received signal and may be connected in parallel to each other. For example, the unit amplification circuits may be realized as inverters INV2_1, INV2_2, and INV2_3. As described with reference to FIG. 4, the unit amplification circuits may be realized by using logic elements, such as NAND gates, NOR gates or XOR gates.

Each of the inverters INV2_1, INV2_2, and INV2_3, which are connected in parallel to each other, corresponds to the unit amplification circuit and the inverters INV2_1, INV2_2, and INV2_3 correspond to the amplification stage When the inverters INV2_1, INV2_2, and INV2_3 are connected in parallel to each other, the average mismatch properties between the inverters INV2_1, INV2_2, and INV2_3 may be reduced.

Figure 7:
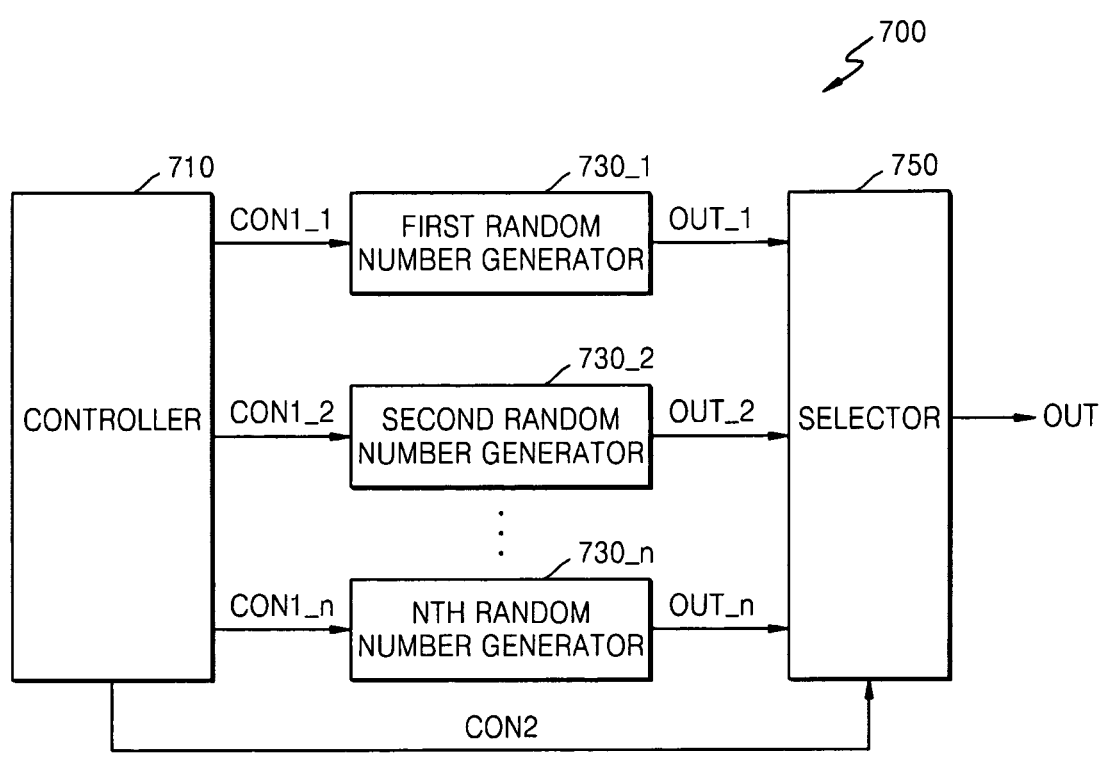
FIG. 7 is a block circuit diagram of a random number generating apparatus according to another exemplary embodiment.

FIG. 7 is a block circuit diagram of a random number generating apparatus 700 according to another exemplary embodiment. The random number generating apparatus 700 of the present embodiment may include a controller 710, a plurality of random number generators 730_1, 730_2, and 730_n, and a selector 750. Each of the random number generators 730_1, 730_2, and 730_n may include a metastable state generating unit, an amplifying unit, and a sampling unit as described with reference to FIGS. 1 and 3 through 6. The random number generators 730_1, 730_2, and 730_n are described with reference to FIGS. 1 and 3 through 6 and thus their descriptions will not be repeated here.

Referring to FIG. 7, the controller 710 may provide the random number generators 730_1, 730_2, and 730_n with first control signals CON1_1, CON1_2, and CON1_n, respectively, and generate and output a second control signal CON2 to the selector 750. Each of the first control signals CON1_1, CON1_2, and CON1_n may include a sampling clock input into a sampling unit of each of the random number generators 730_1, 730_2, and 730_n, and may further include the select signal SEL input into a metastable state generating unit of each of the random number generators 730_1, 730_2, and 730_n.

The selector 750 may receive signals OUT_1, OUT_2, and OUT_n from the random number generators 730_1, 730_2, and 730_n, respectively, and the second control signal CON2, and selectively output an output signal OUT of the random number generating apparatus 700 in response to the second control signal CON2. For example, the selector 750 may include a multiplexer that selectively outputs the signals OUT_1, OUT_2, and OUT_n which are output from the random number generators 730_1, 730_2, and 730_n, respectively, in response to the second control signal CON2. The second control signal CON2 may include a select signal that selects an output of the multiplexer.

The random number generating apparatus 700 of the present embodiment can increase throughput thereof by connecting in parallel the random number generators 730_1, 730_2, and 730_n with each other.

Figure 8:
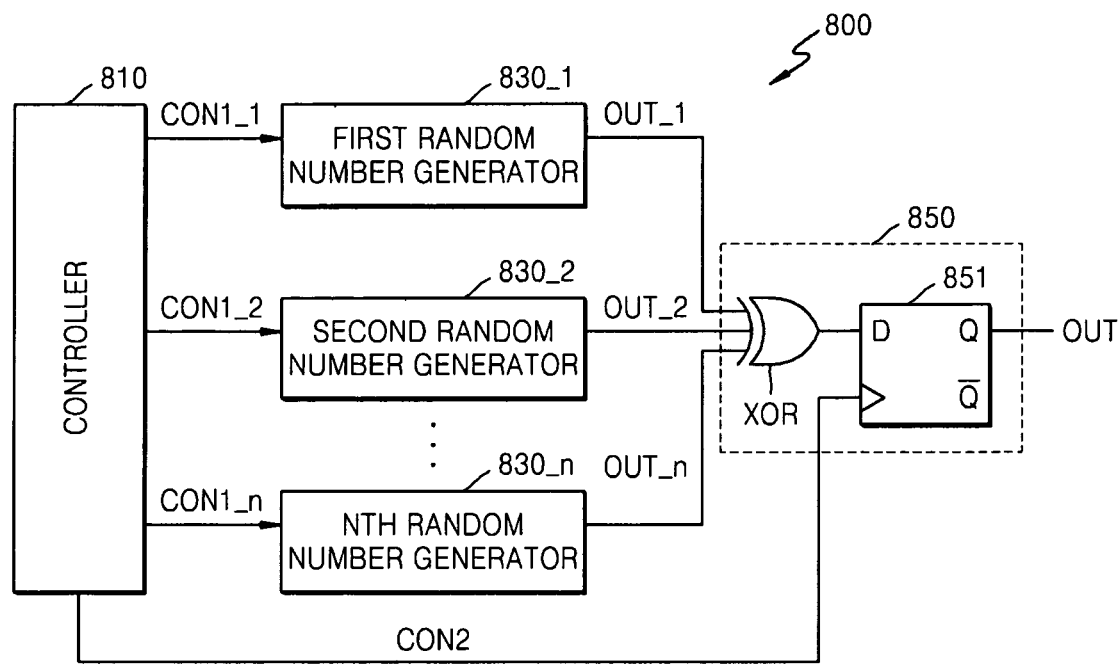
FIG. 8 is a block circuit diagram of a random number generating apparatus according to another exemplary embodiment.

FIG. 8 is a block circuit diagram of a random number generating apparatus 800 according to another exemplary embodiment. The random number generating apparatus 800 of the present embodiment may include a controller 810, a plurality of random number generators 830_1, 830_2, and 830_n, and a selector 850. The controller 810 and the random number generators 830_1, 830_2, and 830_n are described with reference to FIG. 7 and thus their descriptions will not be repeated here.

Referring to FIG. 8, the selector 850 may include an XOR gate and a flipflop 851. The XOR gate performs an XOR operation with respect the signals OUT_1, OUT_2, and OUT_n that are output from the random number generators 830_1, 830_2, and 830_n, respectively, and outputs the XOR performed signal. The flipflop 851 receives the output signal of the XOR gate, and samples and outputs the received output signal in response to the second control signal CON2. The second control signal CON2 may include a sampling clock.

Since the XOR operation is performed with respect to the signals OUT_1, OUT_2, and OUT_n that are output from the random number generators 830_1, 830_2, and 830_n, respectively, the stochastic properties of the random number generating apparatus 800 of the present embodiment are advantageously defined according to the best stochastic properties of one of the random number generators 830_1, 830_2, and 830_n. For example, if even one random number generator has good stochastic properties because of the properties of the XOR operation, an output of whole random number generators has good stochastic properties. The good stochastic properties represent properties close to a true random number.

Figure 9:
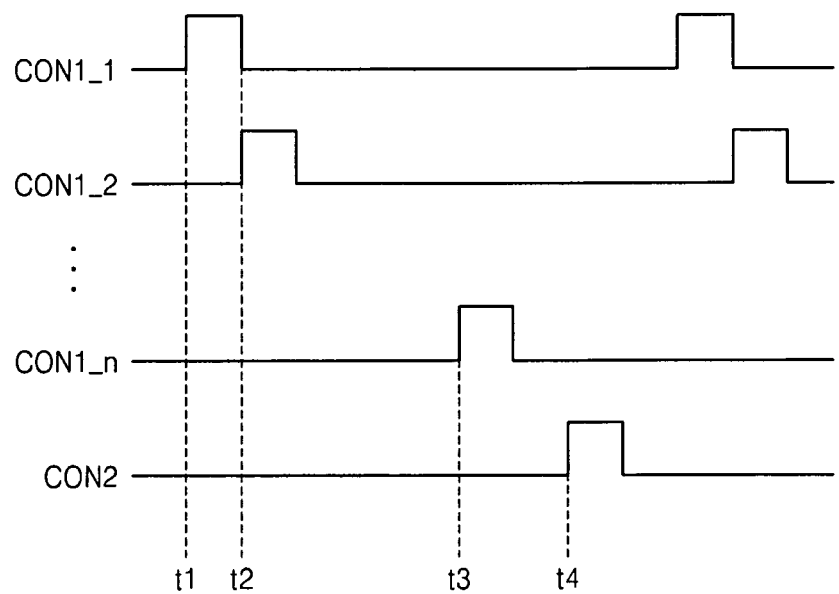
FIG. 9 is a timing diagram of a plurality of sampling clocks that are input into a plurality of random number generators according to an exemplary embodiment.

FIG. 9 is a timing diagram of a plurality of sampling clocks that are input into a plurality of random number generators according to an exemplary embodiment. In the random number generating apparatus 700 or 800 shown in FIG. 7 or 8, waveforms of the first control signals CON1_1, CON1_2, and CON1_n that are input into the random number generators, respectively, are similar to those shown in FIG. 9.

Referring to FIGS. 8 and 9, the first control signals CON1_1, CON1_2, and CON1_n that are input into the random number generators 830_1, 830_2, and 830_n, respectively, may have different delay time in a temporal axis. Therefore, since the first control signals CON1_1, CON1_2, and CON1_n that are input into the random number generators 830_1, 830_2, and 830_n, respectively, have different sampling time, each of the random number generators 830_1, 830_2, and 830_n is sampled at a different time. For example, the first random number generator 830_1 into which the first control signal CON1_1 inputs may be sampled at a time t1, the second random number generator 830_2 into which the second control signal CON1_2 inputs may be sampled at a time t2, and the $n^{th}$ random number generator 830_n into which the $n^{th}$ control signal CON1_n inputs may be sampled at a time t3. Meanwhile, the sampling unit 850 into which the second control signal CON2 inputs may perform a sampling operation at a time t4.

Cross-talking may occur between a plurality of random number generators included in a random number generating apparatus, which degrades an output result of the random number generating apparatus. That is, sampling clocks having different delay time may be provided to the random number generators so as to reduce a parasitic effect, such as cross-talking.

Figure 10:
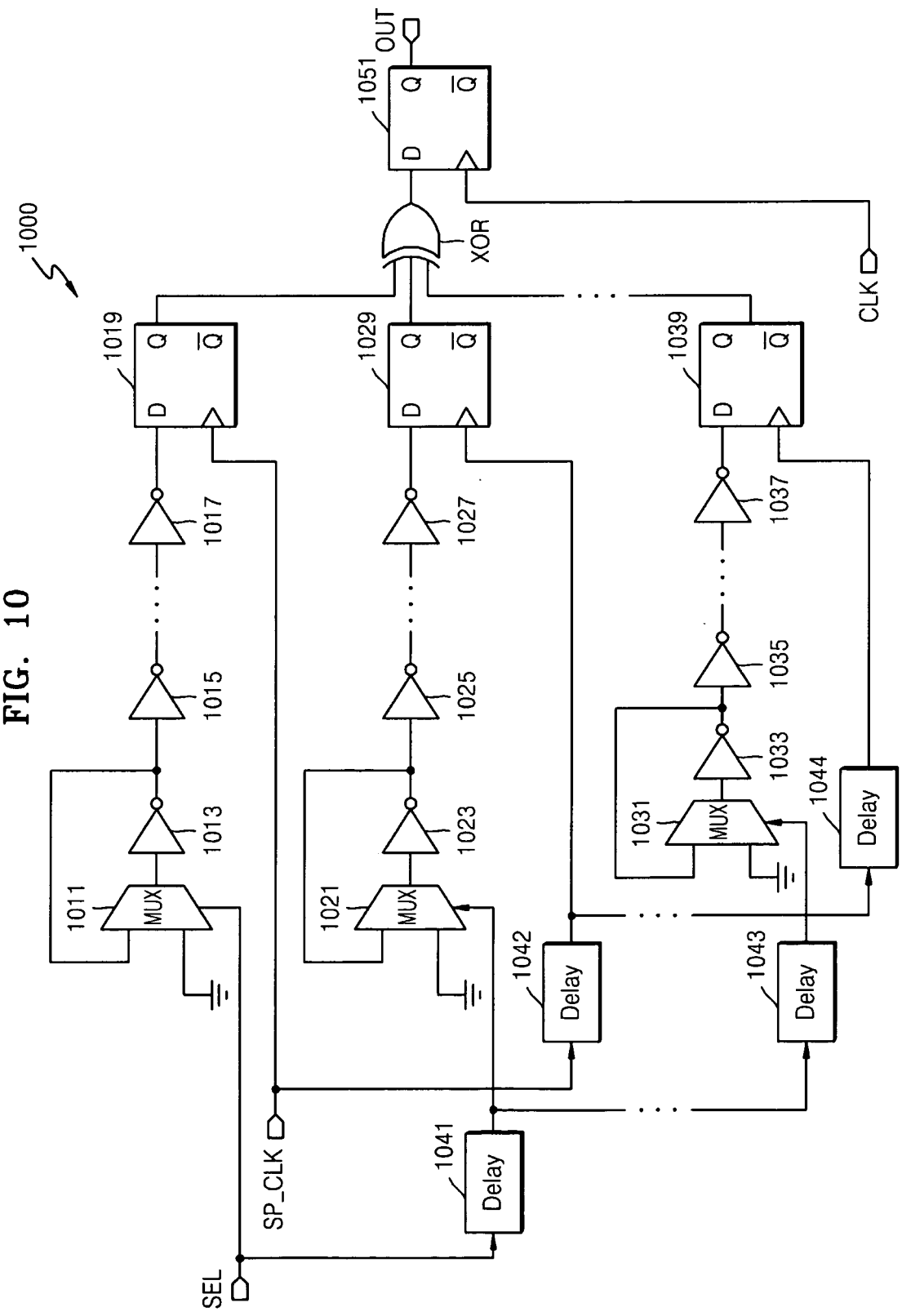
FIG. 10 is a circuit diagram of a random number generating apparatus according to another exemplary embodiment.

FIG. 10 is a circuit diagram of a random number generating apparatus 1000 according to another exemplary embodiment. Referring to FIG. 10, the random number generating apparatus 1000 may include at least one delay unit 1041 through 1044 to generate sampling clocks having different delay time. A sampling clock CP_CLK is input into a flipflop 1019. A signal of the sampling clock CP_CLK that is delayed by the delay unit 1041 is input into a flipflop 1029. A signal of the sampling clock CP_CLK that is delayed by the delay units 1042 and 1044 is input into a flipflop 1039. Similarly to the sampling clock SP_CLK, the select signals SEL having different delay time are input into multiplexers 1011, 1021, and 1031, respectively. The operation of the random number generating apparatus 1000 is described with reference to FIGS. 8 and 9 and thus its detailed description will not be repeated here.

Figure 11:
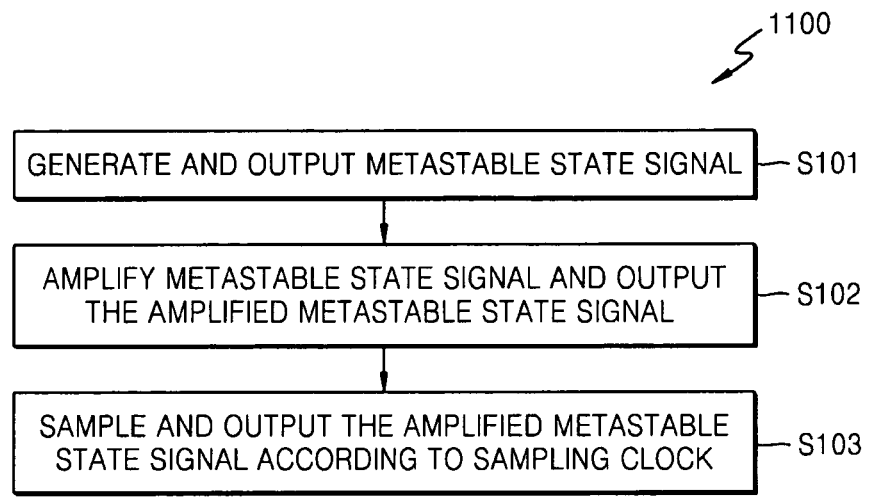
FIG. 11 is a flowchart illustrating a random number generating method according to an exemplary embodiment.

FIG. 11 is a flowchart illustrating a random number generating method 1100 according to an exemplary embodiment. Referring to FIG. 11, the random number generating method 1100 may include generating and outputting a metastable state signal (operation 101), receiving the metastable state signal, amplifying the received metastable state signal, and outputting the amplified metastable state signal (operation 102), and receiving the amplified metastable state signal and a sampling clock, and sampling and outputting the amplified metastable state signal according to the sampling clock (operation 103). The random number generating method 1100 is fully described with reference to FIGS. 1 through 10 and thus its detailed description will not be repeated here.

An apparatus and method for generating a random number according to an exemplary embodiment of the inventive concept can increase throughput of a TRNG using metastability. Also, the apparatus and method for generating a random number do not need a particular layout design and can be realized using a general digital element.

While the inventive concept has been particularly shown and described with reference to exemplary embodiments thereof, it will be understood that various changes in form and details may be made therein without departing from the spirit and scope of the following claims.

What is claimed is:

1. An apparatus for generating a random number, the apparatus comprising:
   a metastable state generating unit generating and outputting a metastable state signal;
   an amplifying unit receiving the metastable state signal from the metastable state generating unit, amplifying the received metastable state signal, and outputting the amplified metastable state signal; and
   a sampling unit receiving the amplified metastable state signal and a sampling clock, and sampling and outputting the amplified metastable state signal according to the sampling clock.

2. The apparatus of claim 1, wherein the metastable state generating unit comprises an inverting unit inverting and outputting an input signal, wherein an output terminal and an input terminal of the inverting unit are connected to each other.

3. The apparatus of claim 2, wherein the metastable state generating unit further comprises a multiplexer receiving a select signal and selectively outputting input signals in response to the select signal, wherein a first input terminal of the multiplexer is connected to the output terminal of the inverting unit, a second input terminal of the multiplexer is connected to a first power voltage, and an output terminal of the multiplexer is connected to the input terminal of the inverting unit.

4. The apparatus of claim 1, wherein the metastable state generating unit comprises a plurality of inverting units inverting and outputting an input signal, wherein:
   the plurality of inverting units are connected in parallel to each other, and
   an output terminal and input terminal of each of the plurality of inverting units are connected to each other.

5. The apparatus of claim 4, wherein the amplifying unit comprises a plurality of amplification stages amplifying and outputting an input signal, wherein:
   the plurality of amplification stages are connected in series to each other,
   each of the plurality of amplification stages comprises a plurality of unit amplification circuits amplifying and outputting the input signal, and
   the plurality of unit amplification circuits are connected in parallel to each other.

6. An apparatus for generating a random number including a plurality of random number generators, the apparatus comprising:
   a controller providing the plurality of random number generators with a first control signal and generating and outputting a second control signal; and
   a selector receiving a signal from each of the plurality of random number generators and the second control signal, and selectively outputting an output signal of the apparatus in response to the second control signal,
   wherein each of the plurality of random number generators comprises:

a metastable state generating unit generating and outputting a metastable state signal;

an amplifying unit receiving the metastable state signal from the metastable state generating unit, amplifying the received metastable state signal, and outputting the amplified metastable state signal; and a sampling unit receiving the amplified metastable state signal and a sampling clock, and sampling and outputting the amplified metastable state signal according to the sampling clock.

7. The apparatus of claim 6, wherein the selector comprises a multiplexer selectively outputting the signal of each of the plurality of random number generators in response to the second control signal.

8. The apparatus of claim 6, wherein the selector comprises:

an XOR gate performing an XOR operation with regard to the signal of each of the plurality of random number generators and outputting the XOR performed signal; and a flipflop receiving the output signal of the XOR gate, and sampling and outputting the received output signal of the XOR gate in response to the second control signal.

9. The apparatus of claim 6, wherein the first control signal comprises a plurality of sampling clocks that are input into the plurality of random number generators, wherein the plurality of sampling clocks have different delay time.

10. A method of generating a random number, the method comprising:

generating and outputting by a metastable state generating unit a metastable state signal;

receiving by an amplifying unit the metastable state signal, amplifying by the amplifying unit the received metastable state signal, and outputting by the amplifying unit the amplified metastable state signal; and receiving by a sampling unit the amplified metastable state signal and a sampling clock, and sampling and outputting by the sampling unit the amplified metastable state signal according to the sampling clock.

* * * * *